United States Patent
Mallavajula et al.

(10) Patent No.: US 10,128,846 B2
(45) Date of Patent: Nov. 13, 2018

(54) APPARATUS AND METHOD FOR DATA LEVEL SHIFTING WITH BOOST ASSISTED INPUTS FOR HIGH SPEED AND LOW VOLTAGE APPLICATIONS

(71) Applicant: QUALCOMM Incorporated, San Diego, CA (US)

(72) Inventors: Yeshwanth Kumar Mallavajula, San Diego, CA (US); Wilson Chen, San Diego, CA (US); Chiew-Guan Tan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/478,063

(22) Filed: Apr. 3, 2017

(65) Prior Publication Data

US 2018/0287609 A1    Oct. 4, 2018

(51) Int. Cl.
*H03K 19/00* (2006.01)
*H03K 17/687* (2006.01)
*H03K 19/0185* (2006.01)
*H03K 17/06* (2006.01)

(52) U.S. Cl.
CPC ....... *H03K 19/0013* (2013.01); *H03K 17/063* (2013.01); *H03K 17/6872* (2013.01); *H03K 19/018521* (2013.01); *H03K 19/018528* (2013.01)

(58) Field of Classification Search
CPC ....... H03K 19/0013; H03K 19/018521; H03K 17/6872; H03K 19/018528; H03K 19/018514; H03K 19/018507; H03K 17/063
See application file for complete search history.

(56) References Cited

U.S. PATENT DOCUMENTS

| 7,265,583 | B2* | 9/2007 | Hirano | ............. | H03K 3/356113 |
| | | | | | 326/62 |
| 7,592,850 | B2* | 9/2009 | Woo | ................... | H03K 3/35613 |
| | | | | | 326/68 |
| 7,750,718 | B2 | 7/2010 | Kim | | |
| 7,839,171 | B1 | 11/2010 | Miles et al. | | |
| 9,246,493 | B2 | 1/2016 | Kawasaki | | |
| 9,444,463 | B2 | 9/2016 | Rao et al. | | |
| 9,496,873 | B2 | 11/2016 | Li et al. | | |

(Continued)

OTHER PUBLICATIONS

International Search Report and Written Opinion—PCT/US2018/023168—ISA/EPO—dated Jun. 26, 2018.

*Primary Examiner* — Jung Kim (74) *Attorney, Agent, or Firm* — Loza & Loza, LLP/Qualcomm (57) ABSTRACT

The disclosure relates to a data level shifter circuit including a boost circuit configured to generate a boosted input data signal based on a transition of an input data signal; a first input transistor including a first control signal configured to receive the input data signal; a second input transistor including a second control terminal configured to receive the boosted input data signal, wherein the first and second input transistors are coupled in parallel between a node and a lower voltage rail; and a latch circuit configured to generate an output data signal based on the input data signal, wherein the latch circuit is coupled between an upper voltage rail and the node.

11 Claims, 5 Drawing Sheets

(56) References Cited

U.S. PATENT DOCUMENTS

2006/0044888 A1 3/2006 Kim et al.
2013/0328611 A1 12/2013 Kumar et al.
2017/0085265 A1 3/2017 Roham et al.

* cited by examiner

APPARATUS AND METHOD FOR DATA LEVEL SHIFTING WITH BOOST ASSISTED INPUTS FOR HIGH SPEED AND LOW VOLTAGE APPLICATIONS

BACKGROUND

Field

Aspects of the present disclosure relate generally to data level shifters, and in particular, to an apparatus and method for data level shifting with boost assisted inputs for high speed and low voltage applications.

Background

Level shifters are a key component in various circuit blocks used to shift signals from one voltage domain to another. One particular level shifter that is extensively used in input/output (I/O) circuits is the one that level shifts signals from VDDCX (core voltage) level to VDDPX (I/O) voltage level. With VDDCX voltage levels dropping from one technology node to another, the reliability limits for core devices also keep dropping. However, the VDDPX voltage levels remain the same to conform to I/O interface standards. It becomes challenging to design level shifters without impacting reliability of thin oxide core devices.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a boost circuit configured to generate a boosted input data signal based on a transition of an input data signal; a first input transistor including a first control signal configured to receive the input data signal; a second input transistor including a second control terminal configured to receive the boosted input data signal, wherein the first and second input transistors are coupled in parallel between a first node and a first voltage rail; and a latch circuit configured to generate an output data signal based on the input data signal, wherein the latch circuit is coupled between a second voltage rail and the first node.

Another aspect of the disclosure relates to a method including generating a boosted input high logic voltage based on a transition of an input data signal; and changing a state of a latch circuit by pulling down a high logic voltage to a low logic voltage at a node within the latch circuit by creating separate conductive paths between the node and a low voltage rail in response to the input data signal and the boosted input high logic voltage, respectively.

Another aspect of the disclosure relates to an apparatus including means for generating a boosted input high logic voltage based on a transition of an input data signal; and means for changing a state of a latch circuit by pulling down a high logic voltage to a low logic voltage at a node within the latch circuit by creating separate conductive paths between the node and a low voltage rail in response to the input data signal and the boosted input high logic voltage, respectively.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

In summary, the disclosure relates to a data level shifter configured to level shift an input data differential signal Vin+/Vin− in a first voltage domain (VDD1) (e.g., a core voltage domain, VDDCX) to generate an output data differential signal Vout+/Vout− in a second voltage domain (VDD2) (e.g., an (I/O) voltage domain, VDDPX).

To achieve lower power consumption and fast data processing speed by core circuits, the first voltage domain VDD1 may be set to have small voltages (e.g., 500 millivolts (mV) or less) and use relatively thin oxide devices. To comply with I/O standard interface, the second voltage domain VDD2 may be set to have larger voltages (e.g., 1.95V) and use relatively thicker oxide devices (hereinafter, "thick oxide devices"). The difficulties with large voltage differences between the two voltage domains include potentially subjecting the thin oxide devices to voltages above their reliability limits, and sufficiently driving the thick oxide devices to properly operate the data level shifter. These difficulties are addressed with various implementations of data level shifters described herein.

Various embodiments of a data level shifter are described herein. Each data level shifter includes a latch circuit and two-sets of parallel input differential transistors for causing a state of the latch circuit to change based on an input differential signal applied to the two-sets of parallel input differential transistors. One set of the input differential transistors are configured to receive the input differential signal directly. The other set of the input differential transistors are configured to receive a boosted input differential signal. The input differential signal and the boosted differential signal being applied to the parallel input differential transistors provide a sufficiently low resistance path to ground to cause the state of the latch circuit to change.

Figure 1:
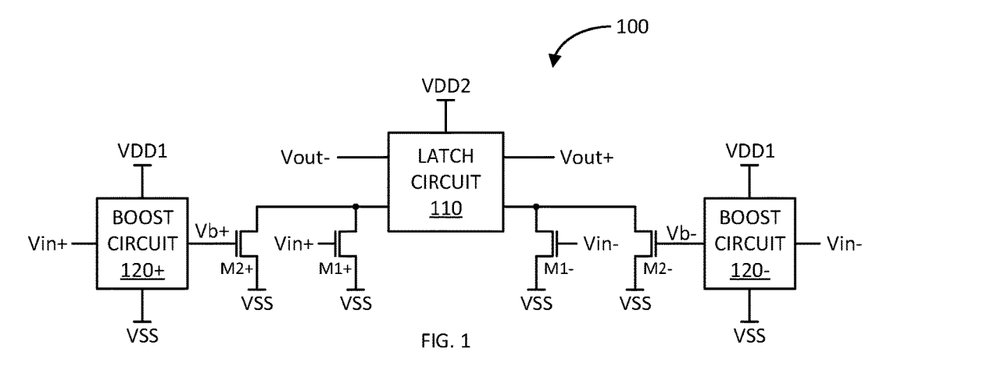
FIG. 1 illustrates a block/schematic diagram of an exemplary data level shifter in accordance with an aspect of the disclosure.

FIG. 1 illustrates a block/schematic diagram of an exemplary data level shifter 100 in accordance with an aspect of the disclosure. The level shifter 100 includes a latch circuit 110, a first set of input differential transistors M1+/M1−, a second set of input differential transistors M2+/M2−, and a set of differential boost circuits 120+/120−. Each of the first and second sets of input differential transistors may be configured as an n-channel metal oxide semiconductor (NMOS) field effect transistor (FET).

The first set of differential transistors M1+/M1− are coupled between the latch circuit 110 and a lower voltage rail VSS (e.g., ground), respectively. The first set of differential transistors M1+/M1− include control terminals (e.g., gates) configured to receive positive/negative components of an input differential signal Vin+/Vin−, respectively.

Similarly, the differential boost circuits 120+/120− are configured to receive the positive/negative components of the input differential signal Vin+/Vin−, respectively. The differential boosts circuits 120+/120− are coupled between a first upper voltage rail VDD1 and the lower voltage rail VSS. Accordingly, the differential boost circuits 120+/120− operate under a first voltage domain (VDD1/VSS). For example, the first voltage domain (VDD1/VSS) may be a core voltage domain that uses relatively thin oxide core devices. The differential boost circuits 120+/120− are configured to generate voltage-boosted input differential signal Vb+/Vb− based on the input differential signal Vin+/Vin−, respectively. The boosted input differential signal Vb+/Vb− includes a high logic voltage greater than the high logic voltage VDD1 of the first voltage domain.

The second set of differential transistors M2+/M2− are also coupled between the latch circuit 110 and the lower voltage rail VSS, respectively. The second set of differential transistors M2+/M2− include control terminals (e.g., gates) configured to receive the positive/negative components of the boosted input differential signal Vb+/Vb−, respectively.

The latch circuit 110 is coupled between a second upper voltage rail VDD2 and the first and second sets of parallel input differential transistors M1+/M1− and M2+/M2−, respectively. The upper voltage rail VDD2 may be associated with a second voltage domain (VDD2/VSS), where the high logic voltage VDD2 (e.g., 1.95V) of the second voltage domain is greater than the high logic voltage VDD1 (e.g., 500 mV or less) of the first voltage domain. As an example, the second voltage domain may be an I/O voltage domain that uses relatively thick oxide core devices. As the first and second sets of input differential transistors M1+/M1− and M2+/M2− are exposed to the high logic voltage VDD2 of the second voltage domain via the latch circuit, these transistors are configured as relatively thick oxide devices.

In operation, the latch circuit 110 is configured to generate an output differential signal Vout+/Vout− in the second voltage domain (VDD2/VSS) based on the input differential signal Vin+/Vin− in the first voltage domain (VDD1/VSS).

For instance, if the input differential signal Vin+/Vin− is at a high/low state, the boost circuit 120+ boosts the high input voltage Vin+ to generate Vb+ at a voltage greater than VDD1, and the boost circuit 120− generates Vb− at substantially VSS. The high input voltage Vin+ and boosted high input voltage Vb+ turn on transistors M1+ and M2+, respectively, with sufficient aggregate conductivity to pull down the high output voltage Vout− to cause the latch circuit 110 to change state and produce the output differential signal Vout+/Vout− at a corresponding high/low state.

Similarly, if the input differential signal Vin+/Vin− is at a low/high state, the boost circuit 120− boosts the high input voltage Vin− to generate Vb− at a voltage greater than VDD1, and the boost circuit 120+ generates Vb+ at substantially VSS. The high input voltage Vin− and boosted high input voltage Vb− turn on transistors M1− and M2−, respectively, with sufficient aggregate conductivity to pull down the high output voltage Vout+ to cause the latch circuit 110 to change state and produce the output differential signal Vout+/Vout− at a corresponding low/high state.

Figure 2:
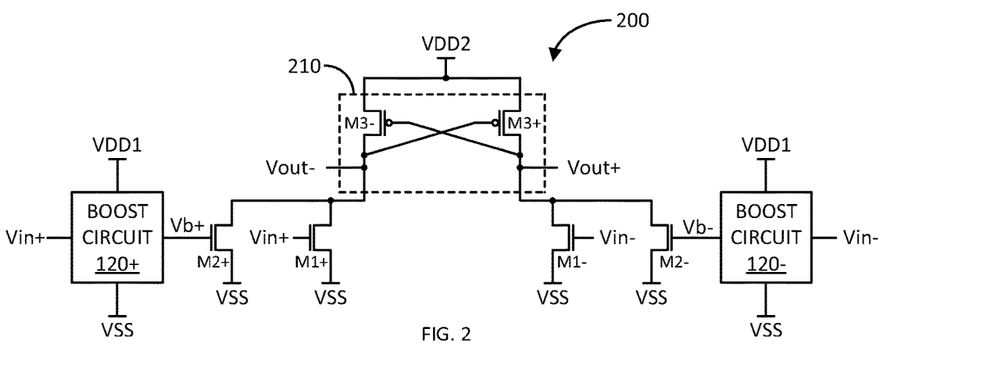
FIG. 2 illustrates a block/schematic diagram of another exemplary data level shifter in accordance with another aspect of the disclosure.

FIG. 2 illustrates a block/schematic diagram of another exemplary data level shifter 200 in accordance with another aspect of the disclosure. The data level shifter 200 is similar to that of data level shifter 100 previously discussed, with the exception that level shifter 200 employs a particular implementation for a latch circuit.

In particular, the level shifter 200 includes the similar first and second sets of input differential transistors M1+/M1− and M2+/M2−, as well as the similar differential boost circuits 120+/120−. In this case, the level shifter 200 includes a latch circuit 210 having a transistor M3− coupled between the second upper voltage rail VDD2 and the parallel input transistors M1+ and M2+. The latch circuit 210 further includes a transistor M3+ coupled between the second upper voltage rail VDD2 and the parallel input transistors M1− and M2−. The differential transistors M3+/M3− may each be configured as a p-channel metal oxide semiconductor (PMOS) FET.

The differential transistors M3+/M3− of the latch circuit 210 are cross-coupled. That is, an output terminal (e.g., drain) of transistor M3+ is coupled to an input terminal (e.g., gate) of transistor M3−, and an output terminal (e.g., drain) of transistor M3− is coupled to an input terminal (e.g., gate) of transistor M3+. The drain of the transistor M3− is coupled to the drains of transistors M1+ and M2+, and the drain of the transistor M3+ is coupled to the drains of transistors M1− and M2−. The output differential signal Vout+/Vout− is produced at the drains of transistors M3+/M3−, respectively.

In operation, the latch circuit 210 is configured to generate an output differential signal Vout+/Vout− in the second voltage domain (VDD2/VSS) based on the input differential signal Vin+/Vin− in the first voltage domain (VDD1/VSS).

For instance, if the input differential signal Vin+/Vin− is at a high/low state, the boost circuit 120+ boosts the high input voltage Vin+ to generate Vb+ at a voltage greater than VDD1, and the boost circuit 120− generates Vb− at substantially VSS. The high input voltage Vin+ and boosted high input voltage Vb+ turn on transistors M1+ and M2+, respectively, with sufficient aggregate conductivity to pull down the high voltage (Vout−) at the gate of transistor M3+ towards VSS so that transistor M3+ turns on. The turning on of transistor M3+ causes the low voltage (Vout+) at the gate of transistor M3− to increase towards VDD2 so that transistor M3− turns off. When transistors M3+ and M3− are fully turned off and on, respectively, the latch circuit 210 has changed state so that the output differential signal Vout+/Vout− is at a corresponding high/low state.

Similarly, if the input differential signal Vin+/Vin− is at a low/high state, the boost circuit 120− boosts the high input voltage Vin− to generate Vb− at a voltage greater than VDD1, and the boost circuit 120+ generates Vb+ at substantially VSS. The high input voltage Vin− and boosted high input voltage Vb− turn on transistors M1− and M2−, respectively, with sufficient aggregate conductivity to pull down the high voltage (Vout+) at the gate of transistor M3− towards VSS so that transistor M3− turns on. The turning on of transistor M3− causes the low voltage (Vout−) at the gate of transistor M3+ to increase towards VDD2 so that transistor M3+ turns off. When transistors M3− and M3+ are fully turned on and off, the latch circuit 210 has changed state so that the output differential signal Vout+/Vout− is at a corresponding low/high state.

Figure 3:
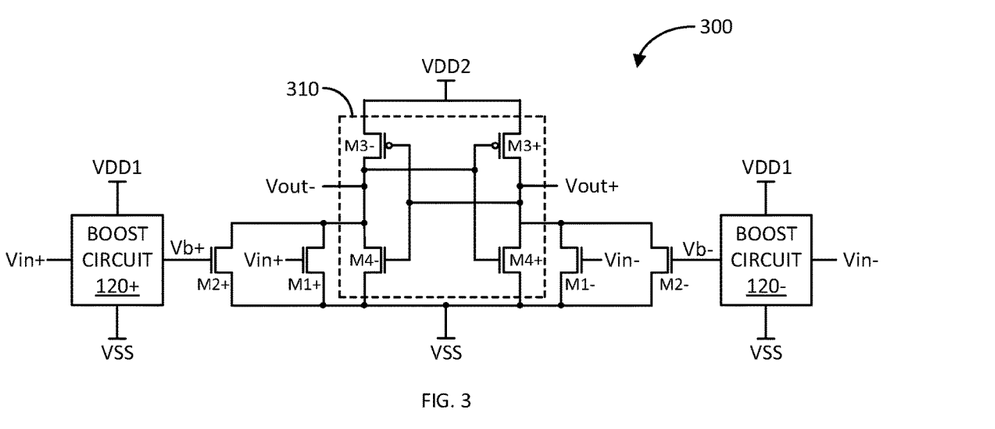
FIG. 3 illustrates a block/schematic diagram of another exemplary data level shifter in accordance with another aspect of the disclosure.

FIG. 3 illustrates a block/schematic diagram of another exemplary data level shifter 300 in accordance with another aspect of the disclosure. The data level shifter 300 is similar to that of data level shifter 100 previously discussed, with the exception that level shifter 300 employs another particular implementation for a latch circuit.

In particular, the level shifter 300 includes the similar first and second sets of input differential transistors M1+/M1− and M2+/M2−, as well as the similar differential boost circuits 120+/120−. In this case, the level shifter 300 includes a latch circuit 310 including two cross-coupled inverters. The first inverter includes transistor M3+ coupled in series with transistor M4+ between the second upper voltage rail VDD2 and the lower voltage rail VSS. The second inverter includes transistor M3− coupled in series with transistor M4− between the second upper voltage rail VDD2 and the lower voltage rail VSS. The transistors M3+/M3− may each be configured as a PMOS FET, and the transistors M4+/M4− may each be configured as an NMOS FET.

As discussed, the first and second inverters are cross-coupled. That is, the output of the first inverter (at the drains of transistors M3+ and M4+) is coupled to the input of the second inverter (at the gates of transistors M3− and M4−); and the output of the second inverter (at the drains of transistors M3− and M4−) is coupled to the input of the first inverter (at the gates of transistors M3+ and M4+). The output differential signal Vout+/Vout− is produced at the outputs of the first and second inverters. Also, the output of the first inverter is coupled to the drains of the transistors M1− and M2−, and the output of the second inverter is coupled to the drains of the transistors M1+ and M2+.

In operation, the latch circuit 310 is configured to generate an output differential signal Vout+/Vout− in the second voltage domain (VDD2/VSS) based on the input differential signal Vin+/Vin− in the first voltage domain (VDD1/VSS).

For instance, if the input differential signal Vin+/Vin− is at a high/low state, the boost circuit 120+ boosts the high input voltage Vin+ to generate Vb+ at a voltage greater than VDD1, and the boost circuit 120− generates Vb− at substantially VSS. The high input voltage Vin+ and boosted high input voltage Vb+ turn on transistors M1+ and M2+, respectively, with sufficient aggregate conductivity to pull down the high voltage (Vout−) at the input of the first inverter (gates of transistors M3+ and M4+) towards VSS. The lowering of the voltage (Vout−) causes transistor M3+ to conduct more and transistor M4+ to conduct less. As a result, the low voltage (Vout+) increases towards VDD2. The increasing of the voltage (Vout+) causes transistor M3− to conduct less and transistor M4− to conduct more. As a result, the voltage (Vout−) decreases towards VSS. When transistors M3+ and M4− are fully turned on and transistors M3− and M4+ are fully turned off, the latch circuit 310 has changed state so that the output differential signal Vout+/Vout− is at a corresponding high/low state.

Similarly, if the input differential signal Vin+/Vin− is at a low/high state, the boost circuit 120− boosts the high input voltage Vin− to generate Vb− at a voltage greater than VDD1, and the boost circuit 120+ generates Vb+ at substantially VSS. The high input voltage Vin− and boosted high input voltage Vb− turn on transistors M1− and M2−, respectively, with sufficient aggregate conductivity to pull down the high voltage (Vout+) at the input of the second inverter (gates of transistors M3− and M4−) towards VSS. The lowering of the voltage (Vout+) causes transistor M3− to conduct more and transistor M4− to conduct less. As a result, the low voltage (Vout−) increases towards VDD2. The increasing of the voltage (Vout−) causes transistor M3+ to conduct less and transistor M4+ to conduct more. As a result, the voltage (Vout+) decreases towards VSS. When transistors M3− and M4+ are fully turned on and transistors M3+ and M4− are fully turned off, the latch circuit 310 has changed state so that the output differential signal Vout+/Vout− is at a corresponding low/high state.

Figure 4:
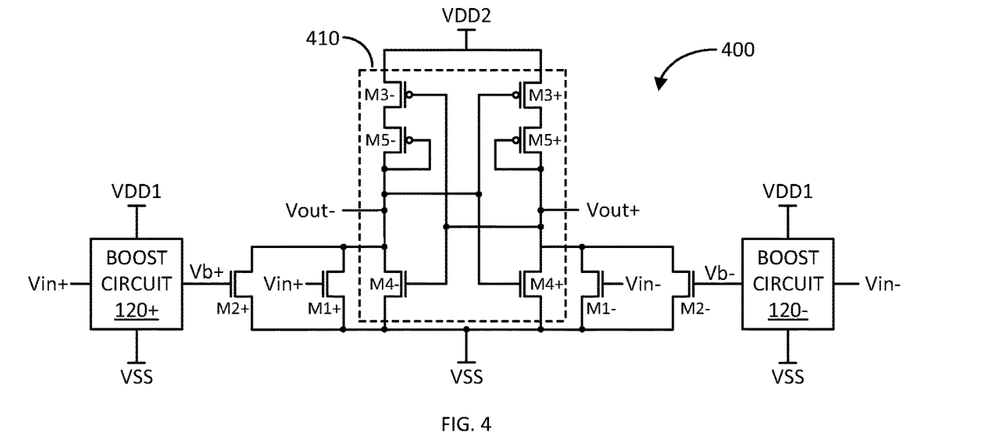
FIG. 4 illustrates a block/schematic diagram of another exemplary data level shifter in accordance with another aspect of the disclosure.

FIG. 4 illustrates a block/schematic diagram of another exemplary data level shifter 400 in accordance with another aspect of the disclosure. The data level shifter 400 is similar to that of data level shifter 300 previously discussed, with the exception that level shifter 400 employs a modified latch circuit.

In particular, the level shifter 400 includes the first and second sets of input differential transistors M1+/M1− and M2+/M2−, as well as the differential boost circuits 120+/120−. In this case, the level shifter 400 includes a latch circuit 410 having two cross-coupled inverters. The first inverter includes transistor M3+, diode-connected transistor M5+, and transistor M4+ coupled in series between the second upper voltage rail VDD2 and the lower voltage rail VSS. The second inverter includes transistor M3−, diode-connected transistor M5−, and transistor M4− coupled in series between the second upper voltage rail VDD2 and the lower voltage rail VSS. The transistors M3+/M3− and M5+/M5− may each be configured as a PMOS FET, and the transistors M4+/M4− may each be configured as an NMOS FET.

As discussed, the first and second inverters are cross-coupled. That is, the output of the first inverter (at the drains of transistors M4+ and M5+) is coupled to the input of the second inverter (at the gates of transistors M3− and M4−); and the output of the second inverter (at the drains of transistors M4− and M5−) is coupled to the input of the first inverter (at the gates of transistors M3+ and M4+). The diode-connected transistors M5+ and M5− assist the corresponding input transistors M1−/M2− and M1+/M2+ in lowering the voltages Vout+/Vout− in response to the input differential signal Vin+/Vin, respectively. The diode-connected transistors M5+ and M5− assist in lowering voltages Vout+/Vout− by producing voltage drops across themselves, respectively.

The output differential signal Vout+/Vout− is generated at the outputs of the first and second inverters. Also, the output of the first inverter is coupled to the drains of the transistors M1− and M2−, and the output of the second inverter is coupled to the drains of the transistors M1+ and M2+.

In operation, the latch circuit 410 is configured to generate an output differential signal Vout+/Vout− in the second voltage domain (VDD2/VSS) based on the input differential signal Vin+/Vin− in the first voltage domain (VDD1/VSS).

For instance, if the input differential signal Vin+/Vin− is at a high/low state, the boost circuit 120+ boosts the high input voltage Vin+ to generate Vb+ at a voltage greater than VDD1, and the boost circuit 120− generates Vb− at substantially VSS. The high input voltage Vin+ and boosted high input voltage Vb+ turn on transistors M1+ and M2+, respectively, with sufficient aggregate conductivity to pull down the high voltage (Vout−) at the input of the first inverter (gates of transistors M3+ and M4+) towards VSS. The lowering of the voltage (Vout−) produces a current through the diode-connected transistor M5−, resulting in a voltage drop across the transistor M5− to assist in lowering the voltage (Vout−) towards VSS.

The lowering of the voltage (Vout−) causes transistor M3+ to conduct more and transistor M4+ to conduct less. As a result, the low voltage (Vout+) increases towards VDD2. The increasing of the voltage (Vout+) causes transistor M3− to conduct less and transistor M4− to conduct more. As a result, the voltage (Vout−) decreases further towards VSS. When transistors M3+ and M4− are fully turned on and transistors M3− and M4+ are fully turned off, the latch circuit 410 has changed state so that the output differential signal Vout+/Vout− is at a corresponding high/low state.

Similarly, if the input differential signal Vin+/Vin− is at a low/high state, the boost circuit 120− boosts the high input voltage Vin− to generate Vb− at a voltage greater than VDD1, and the boost circuit 120+ generates Vb+ at substantially VSS. The high input voltage Vin− and boosted high input voltage Vb− turn on transistors M1− and M2−, respectively, with sufficient aggregate conductivity to pull down the high voltage (Vout+) at the input of the second inverter (gates of transistors M3− and M4−) towards VSS. The lowering of the voltage (Vout+) produces a current through the diode-connected transistor M5+, resulting in a voltage drop across the transistor M5+ to assist in lowering the voltage (Vout+) towards VSS.

The lowering of the voltage (Vout+) causes transistor M3− to conduct more and transistor M4− to conduct less. As a result, the low voltage (Vout−) increases towards VDD2. The increasing of the voltage (Vout−) causes transistor M3+ to conduct less and transistor M4+ to conduct more. As a result, the voltage (Vout+) decreases further towards VSS. When transistors M3− and M4+ are fully turned on and transistors M3+ and M4− are fully turned off, the latch circuit 410 has changed state so that the output differential signal Vout+/Vout− is at a corresponding low/high state.

Figure 5:
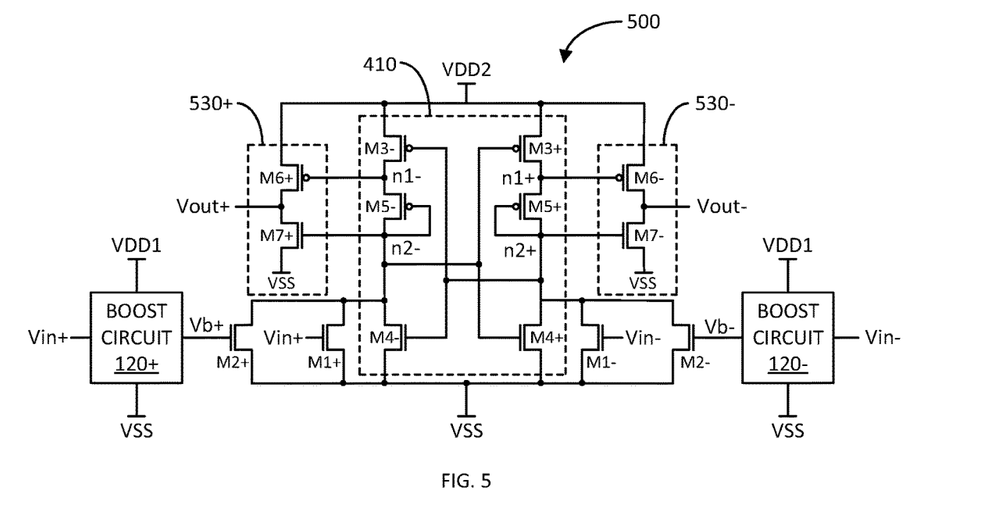
FIG. 5 illustrates a block/schematic diagram of another exemplary data level shifter in accordance with another aspect of the disclosure.

FIG. 5 illustrates a block/schematic diagram of another exemplary data level shifter 500 in accordance with another aspect of the disclosure. The data level shifter 500 is similar to that of data level shifter 400 previously discussed, with the exception that level shifter 500 further includes a pair of output stages to ensure that the output differential signal Vout+/Vout− swings fully between VDD2 and VSS in accordance with the second voltage domain.

In data level shifter 400, the output differential signal Vout+/Vout− may not swing fully between VDD2 and VSS due to a small voltage drop across the corresponding diode-connected transistors M5+/M5− due to leakage current through the turned-off transistors M4+, M1−, and M2− and M4−, M1+, and M2+, respectively.

The level shifter 500 includes the first and second sets of input differential transistors M1+/M1− and M2+/M2−, the differential boost circuits 120+/120−, and the latch circuit 410 previously discussed. The level shifter 500 further includes first and second output stages 530+/530−.

The first output stage 530+ includes a transistor M6+ (e.g., a PMOS FET) and a second transistor M7+ (e.g., an NMOS FET) coupled in series between the second upper voltage rail VDD2 and the lower voltage rail VSS. The gate of transistor M6+ is coupled to the drain and source of transistors M3− and M5−, respectively. The gate of transistor M7+ is coupled to the drains of transistors M5− and M4−.

The second output stage 530− includes a transistor M6− (e.g., a PMOS FET) and a second transistor M7− (e.g., an NMOS FET) coupled in series between the second upper voltage rail VDD2 and the lower voltage rail VSS. The gate of transistor M6− is coupled to the drain and source of transistors M3+ and M5+, respectively. The gate of transistor M7− is coupled to the drains of transistors M5+ and M4+.

The output differential signal Vout+/Vout− is generated at the outputs of the first and second output stages 530+/530−, respectively. That is, the positive component of the output differential signal Vout+ is generated at the drains of transistors M6+ and M7+; and the negative component of the output differential signal Vout− is generated at the drains of transistors M6− and M7−.

In operation, the data level shifter 500 is configured to generate an output differential signal Vout+/Vout− in the second voltage domain (VDD2/VSS) based on the input differential signal Vin+/Vin− in the first voltage domain (VDD1/VSS).

For instance, if the input differential signal Vin+/Vin− is at a high/low state, the boost circuit 120+ boosts the high input voltage Vin+ to generate Vb+ at a voltage greater than VDD1, and the boost circuit 120− generates Vb− at substantially VSS. The high input voltage Vin+ and boosted high input voltage Vb+ turn on transistors M1+ and M2+, respectively, with sufficient aggregate conductivity to pull down the high voltage at the input (node n2−) of the first latch inverter (gates of transistors M3+ and M4+) towards VSS. The lowering of the voltage at node n2− produces a current through the diode-connected transistor M5−, resulting in a voltage drop across the transistor M5− to assist in further lowering the voltage at node n2− towards VSS.

The lowering of the voltage at node n2− causes transistor M3+ to conduct more and transistor M4+ to conduct less. As a result, the low voltage at node n2+ increases towards VDD2. The increasing of the voltage at node n2+ causes transistor M3− to conduct less and transistor M4− to conduct more. As a result, the voltage at node n2− continues to decrease towards VSS. When transistors M3+ and M4− are fully turned on and transistors M3− and M4+ are fully turned off, the voltages at nodes n1+ and n2+ are logically high, and the voltages at nodes n1− and n2− are logically low.

The low logic voltages at nodes n1− and n2− (the effective input to the first output stage 530+) cause the transistors M6+ and M7+ to turn on and off, respectively. Accordingly, the first output stage 530+ generates the positive component of the output differential signal Vout+ at a high logic voltage (e.g., substantially at VDD2). Similarly, the high logic voltages at nodes n1+ and n2+ (the effective input to the second output stage 530−) cause the transistors M6− and M7− to turn off and on, respectively. Accordingly, the second output stage 530− generates the negative component of the output differential signal Vout− at a low logic voltage (e.g., substantially at VSS).

Similarly, if the input differential signal Vin+/Vin− is at a low/high state, the boost circuit 120− boosts the high input voltage Vin− to generate Vb− at a voltage greater than VDD1, and the boost circuit 120+ generates Vb+ at substantially VSS. The high input voltage Vin− and boosted high input voltage Vb− turn on transistors M1− and M2−, respectively, with sufficient aggregate conductivity to pull down the high voltage at the input (node n2+) of the second latch inverter (gates of transistors M3− and M4−) towards VSS. The lowering of the voltage at node n2+ produces a current through the diode-connected transistor M5+, resulting in a voltage drop across the transistor M5+ to assist in further lowering the voltage at node n2+ towards VSS.

The lowering of the voltage at node n2+ causes transistor M3− to conduct more and transistor M4− to conduct less. As a result, the low voltage at node n2− increases towards VDD2. The increasing of the voltage at node n2− causes transistor M3+ to conduct less and transistor M4+ to conduct more. As a result, the voltage at node n2+ continues to decrease towards VSS. When transistors M3− and M4+ are fully turned on and transistors M3+ and M4− are fully turned off, the voltages at nodes n1− and n2− are logically high, and the voltages at nodes n1+ and n2+ are logically low.

The high logic voltages at nodes n1− and n2− (the effective input to the first output stage 530+) cause the transistors M6+ and M7+ to turn off and on, respectively. Accordingly, the first output stage 530+ generates the positive component of the output differential signal Vout+ at a low logic voltage (e.g., substantially at VSS). Similarly, the low logic voltages at nodes n1+ and n2+ (the effective input to the second output stage 530−) cause the transistors M6− and M7− to turn on and off, respectively. Accordingly, the second output stage 530− generates the negative component of the output differential signal Vout− at a high logic voltage (e.g., substantially at VDD2).

Figure 6A:
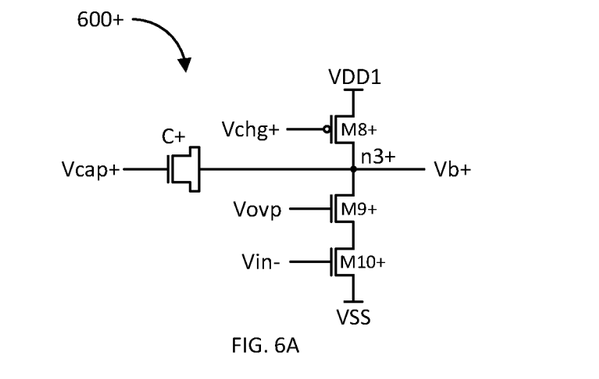
FIG. 6A illustrates a schematic diagram of an exemplary boost circuit for a data level shifter in accordance with another aspect of the disclosure.

FIG. 6A illustrates a schematic diagram of an exemplary boost circuit 600+ for a data level shifter in accordance with another aspect of the disclosure. The boost circuit 600+ is an exemplary detailed implementation of the boost circuit 120+ previously described.

The boost circuit 600+ includes a transistor M8+ (e.g., a PMOS FET), a transistor M9+ (e.g., an NMOS FET), and a transistor M10+ (e.g., an NMOS FET), all coupled in series between the first upper voltage rail VDD1 and the lower voltage rail VSS. The transistor M8+ includes a control terminal (e.g., gate) configured to receive a Vchg+ signal for charging a capacitor C+ as an intermediate step in generating the boosted input voltage Vb+, as discussed in more detail further herein.

The transistor M9+ includes a control terminal (e.g., gate) configured to receive a substantially constant bias voltage Vovp (e.g., at substantially VDD1) for protecting the transistor M10+ from over-voltage stress due to the boosted voltage Vb+. The transistor M10+ includes a control terminal (e.g., gate) configured to receive the negative component of the input differential signal Vin−. As discussed in more detail herein, when the negative component of the input differential signal Vin− is at a high logic voltage (e.g., at substantially VDD1), the transistor M10+ turns on for discharging the capacitor C+.

As mentioned, the boost circuit 600+ further includes the capacitor C+ including a first terminal configured to receive a signal Vcap+ and a second terminal coupled to node n3+. The capacitor C+ may be configured as an NMOS FET with the gate serving as the first terminal, and the drain and source coupled together and serving as the second terminal.

Figure 6B:
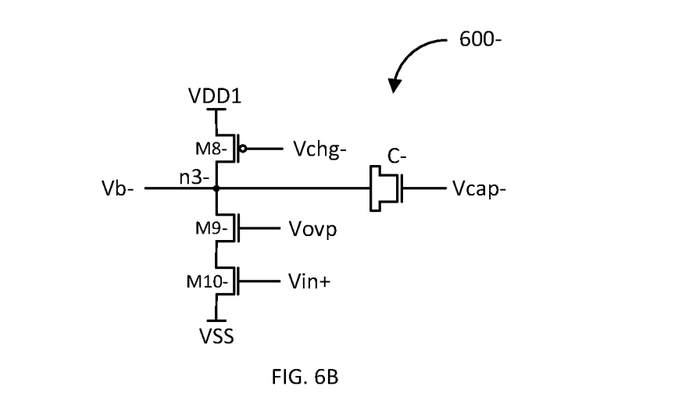
FIG. 6B illustrates a schematic diagram of another exemplary boost circuit for a data level shifter in accordance with another aspect of the disclosure.

FIG. 6B illustrates a schematic diagram of another exemplary boost circuit 600− for a data level shifter in accordance with another aspect of the disclosure. The boost circuit 600− is an exemplary detailed implementation of the boost circuit 120− previously described.

The boost circuit 600− includes a transistor M8− (e.g., a PMOS FET), a transistor M9− (e.g., an NMOS FET), and a transistor M10− (e.g., an NMOS FET), all coupled in series between the first upper voltage rail VDD1 and the lower voltage rail VSS. The transistor M8− includes a control terminal (e.g., gate) configured to receive a Vchg− signal for charging a capacitor C− as an intermediate step in generating the boosted input voltage Vb−, as discussed in more detail further herein.

The transistor M9− includes a control terminal (e.g., gate) configured to receive the substantially constant bias voltage Vovp for protecting the transistor M10− from over-voltage stress due to the boosted voltage Vb−. The transistor M10− includes a control terminal (e.g., gate) configured to receive the positive component of the input differential signal Vin+. As discussed in more detail herein, when the positive component of the input differential signal Vin+ is at a high logic voltage (e.g., at substantially VDD1), the transistor M10− turns on for discharging the capacitor C−.

As mentioned, the boost circuit 600− further includes the capacitor C− including a first terminal configured to receive a signal Vcap− and a second terminal coupled to the node n3−. The capacitor C− may be configured as an NMOS FET with a gate serving as the first terminal, and drain and source coupled together and serving as the second terminal.

Figure 6C:
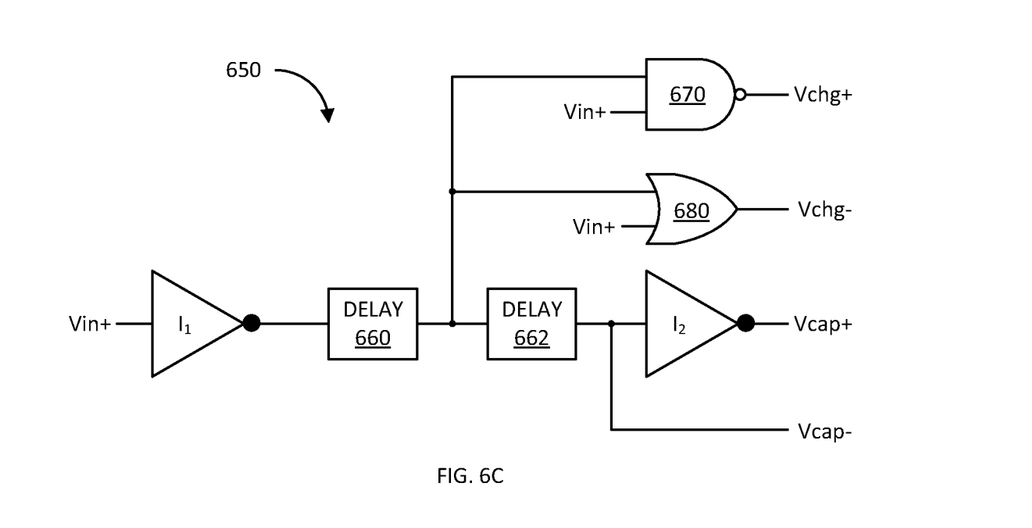
FIG. 6C illustrates a schematic diagram of an exemplary driver circuit for the aforementioned boost circuits in accordance with another aspect of the disclosure.

FIG. 6C illustrates a schematic diagram of an exemplary driver circuit 650 for the differential boost circuits 600+/600− in accordance with another aspect of the disclosure. In particular, the driver circuit 650 is configured to generate the charging and capacitor signals Vchg+ and Vcap+ for boost circuit 600+, and to generate the corresponding charging and capacitor signals Vchg− and Vcap− for boost circuit 600−.

More specifically, the driver circuit 650 includes first and second inverters $I_1$ and $I_2$, first and second delay elements 660 and 662, a NAND gate 670, and an OR gate 680. The first inverter $I_1$ includes an input configured to receive the positive component of the input differential signal Vin+. The first delay element 660 includes an input coupled to an output of the first inverter $I_1$. The first delay element 660 includes an output coupled to respective first inputs of the NAND gate 670 and OR gate 680. The NAND gate 670 and OR gate 680 include respective second inputs configured to receive the positive component of the input differential signal Vin+. The second delay element 662 includes an input coupled to an output of the first delay element 660, and an output coupled to an input of the second inverter $I_2$.

The NAND gate 670 includes an output configured to produce the charging signal Vchg+ for the boost circuit 600+. The OR gate 680 includes an output configured to produce the charging signal Vchg− for the boost circuit 600−. The second inverter $I_2$ includes an output configured to produce the capacitor signal Vcap+ for the boost circuit 600+. The second delay 662 includes an output configured to produce the capacitor voltage Vcap− for the boost circuit 600−. The generation of the boosted input differential voltages Vb+/Vb− is discussed as follows.

Figure 6D:
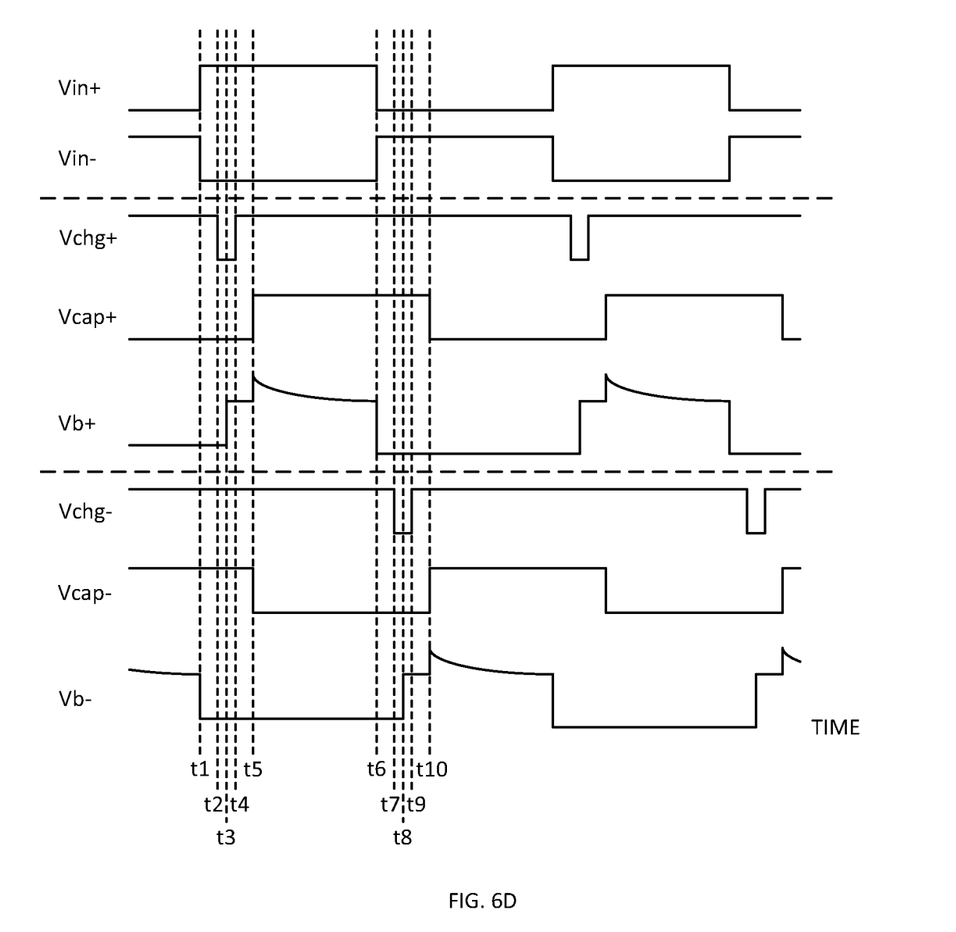
FIG. 6D illustrates a timing diagram of exemplary signals related to the operation of the aforementioned boost circuits and driver circuit in accordance with another aspect of the disclosure.

FIG. 6D illustrates a timing diagram of exemplary signals related to the operation of the differential boost circuits 600+/600− and driver circuit 650 in accordance with another aspect of the disclosure.

The timing diagram includes eight (8) rows, from top-to-bottom, depicting signals Vin+, Vin−, Vchg+, Vcap+, Vb+, Vchg−, Vcap−, and Vb−. An upper horizontal dashed line separates the input differential signal Vin+/Vin− from signals Vchg+, Vcap+, and Vb+ for generating the boost signal Vb+. Similarly, a lower horizontal dashed line separates the signals Vchg+, Vcap+, and Vb+ from the signals Vchg−, Vcap−, and Vb− for generating the boost signal Vb−. Within each row, the vertical axis depicts amplitude of the signal, such as its logic state (high and low) and its boosted level and decay. The horizontal axis represents time.

Between times t1-t5, the boost circuit 600+, in conjunction with the driver circuit 650, operates to generate the boosted input signal Vb+, and the boost circuit 600−, in conjunction with the driver circuit 650, operates to generate Vb− at a low logic voltage.

As an initial condition, prior to time t1, the input differential signal Vin+/Vin− is at a low/high logic state. With regard to the driver circuit 650, the low logic state of the input signal Vin+ causes the NAND gate 670 to generate signal Vchg+ at a high logic voltage. The low logic state of the input signal Vin+ also causes the first inverter $I_1$ to generate a high logic voltage. The high logic voltage causes the OR gate 680 to generate signal Vchg− at a high logic voltage. The high logic voltage generated by the first inverter $I_1$ also causes the second inverter $I_2$ to generate the signal Vcap+ at a low logic voltage.

With regard to boost circuit 600+, in this initial condition, the transistor M8+ is turned off due to the high logic state of signal Vchg+, and the transistor M10+ is turned on due to the high logic state of signal Vin−. As the signal Vcap+ is at a low logic voltage and transistor M10+ is turned on due to Vin− being at a high logic voltage, the capacitor C+ is discharged because both terminals are at low logic voltages (e.g., at VSS). During this phase, the boost circuit 600− is effectively disabled because transistors M8− and M10− are turned off due to the high logic state of signal Vchg− and the low logic state of signal Vin+.

At time t1, the input differential signal Vin+/Vin− transitions to high/low logic state. With regard to boost circuit 600+, the low logic state of signal Vin− turns off transistor M10+ to prevent a short through transistors M8+, M9+, and M10+ when transistor M8+ is subsequently turned on during time interval t2-t4. With regard to boost circuit 600−, the high logic state of signal Vin+ causes transistor M10− to turn on.

With regard to the driver circuit 650, the high logic voltage of signal Vin+ causes both inputs to the NAND gate 670 to be temporarily high. Thus, at time t2, the NAND gate 670 generates signal Vchg+ at a low logic voltage. The low logic voltage of signal Vchg+ causes transistor M8+ of boost circuit 600+ to turn to begin charging the capacitor C+. Thus, the boost voltage Vb+ at node n3+ rises to substantially VDD1 at time t3.

In response to the signal Vin+ transitioning to a high logic voltage at time t1, the first inverter $I_1$ generates a low logic voltage. After a time delay due to the delay element 660, the low logic voltage arrives at the first input of the NAND gate 670. In response, at time t4, the NAND gate 670 generates signal Vchg+ at a high logic voltage. As a result, the transistor M8+ of boost circuit 600+ turns off as the voltage Vb+ has reached substantially VDD1.

The low logic voltage generated by the first inverter $I_1$ reaches the input of the second inverter $I_2$ after a cumulative time delay due to the delay elements 660 and 662. In response to the low logic voltage, at time t5, the second inverter $I_2$ generates the signal Vcap+ at a high logic voltage. The high logic voltage of signal Vcap+, applied to the first terminal of the capacitor C+, pushes or boosts the input voltage Vb+ above VDD1 to turn on transistor M2+ with sufficient conductivity to assist in changing the state of the corresponding latch circuit, as previously discussed.

Also, the low logic voltage generated by the inverter $I_1$, after a cumulative time delay due to the delay elements 660 and 662, causes the signal Vcap− to transition to a low logic voltage at time t5. At such time, both terminals of the capacitor C− of the boost circuit 600− are at low logic voltages to substantially discharge the capacitor C−.

At time t6, the input differential signal Vin+/Vin− transitions to a low/high logic state. With regard to boost circuit 600−, the low logic state of signal Vin+ turns off transistor M10− to prevent a short through transistors M8−, M9−, and M10− when transistor M8− is subsequently turned on during time interval t7-t9. With regard to boost circuit 600+, the high logic state of signal Vin− causes transistor M10+ to turn on.

With regard to the driver circuit 650, the low logic voltage of signal Vin+ causes both inputs to the OR gate 680 to be temporarily low. Thus, at time t7, the OR gate 680 generates signal Vchg− at a low logic voltage. The low logic voltage of signal Vchg− causes transistor M8− of boost circuit 600− to turn to begin charging the capacitor C−. Thus, the boost voltage Vb− at node n3− rises to substantially VDD1 at time t8.

In response to the signal Vin+ transitioning to a low logic voltage at time t6, the first inverter $I_1$ generates a high logic voltage. After a time delay due to the delay element 660, the high logic voltage arrives at the first input of the OR gate 680. In response, at time t9, the OR gate 680 generates signal Vchg− at a high logic voltage. As a result, the transistor M8− of boost circuit 600− turns off as the voltage Vb− has reached substantially VDD1.

The high logic voltage generated by the first inverter $I_1$, after a cumulative time delay due to the delay elements 660 and 662, causes the signal Vcap− to transition to a high logic voltage at time t10. The high logic voltage of signal Vcap−, applied to the first terminal of the capacitor C−, pushes or boosts the input voltage Vb− above VDD1 to turn on transistor M2− with sufficient conductivity to assist in changing the state of the corresponding latch circuit, as previously discussed.

Also at time t10, the high logic voltage generated by the inverter $I_1$, after a cumulative time delay due to the delay elements 660 and 662, causes the inverter $I_2$ to generate Vcap+ at a low logic voltage. At such time, both terminals of the capacitor C+ of the boost circuit 600+ are at low logic voltages to substantially discharge the capacitor C+.

Thus, when the input differential signal Vin+/Vin− becomes high/low at time t1, the boost circuit 600+, in conjunction with the driver circuit 650, generates a boosted input voltage Vb+ above VDD1 at time t5 to turn on transistor M2+ with sufficient conductivity to cause the corresponding latch to change state. Similarly, when the input differential signal Vin+/Vin− becomes low/high at time t6, the boost circuit 600−, in conjunction with the driver circuit 650, generates a boosted input voltage Vb− above VDD1 at time t10 to turn on transistor M2− with sufficient conductivity to cause the corresponding latch to change state.

Figure 7:
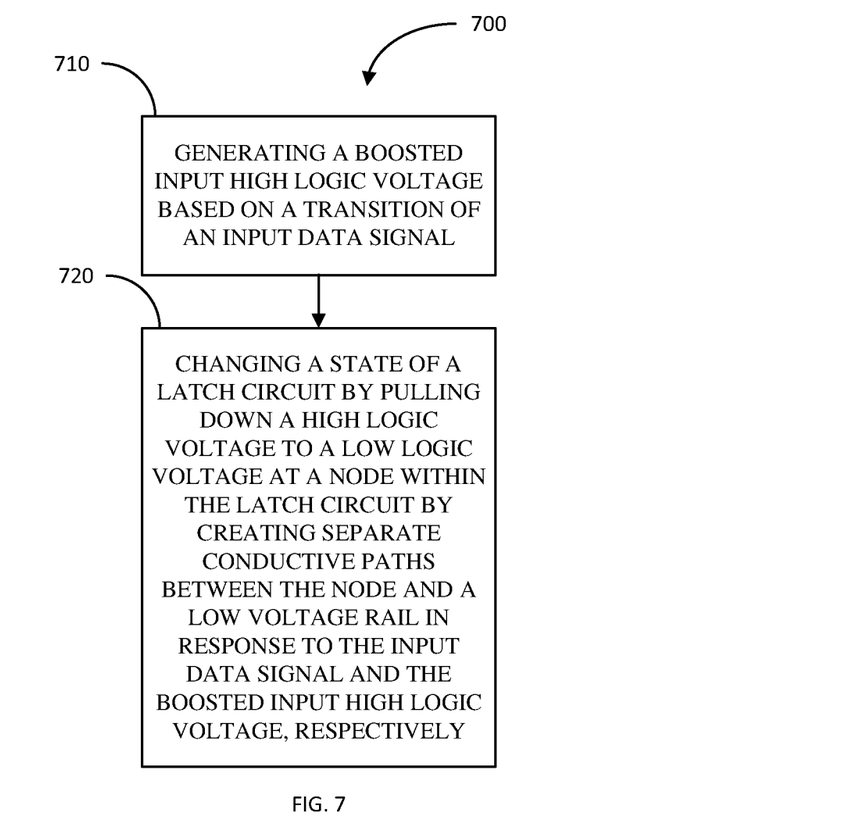
FIG. 7 illustrates a flow diagram of another exemplary method of level shifting an input data signal for generating an output data signal in accordance with another aspect of the disclosure.

FIG. 7 illustrates a flow diagram of another exemplary method 700 of level shifting an input data signal for generating an output data signal in accordance with another aspect of the disclosure.

The method 700 includes generating a boosted input high logic voltage based on a transition of an input data signal (block 710). An example of a means for generating a boosted input high logic voltage based on a transition of an input data signal include any of the boost circuits described herein.

The method 700 further includes changing a state of a latch circuit by pulling down a high logic voltage to a low logic voltage at a node within the latch circuit by creating separate conductive paths between the node and a low voltage rail in response to the input data signal and the boosted input high logic voltage, respectively (block 720). An example of a means for changing a state of a latch circuit by pulling down a high logic voltage to a low logic voltage at a node within the latch circuit by creating separate conductive paths between the node and a low voltage rail in response to the input data signal and the boosted input high logic voltage, respectively, include any of the parallel input transistors described herein.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus comprising:
  a boost circuit configured to generate a boosted input data signal based on a transition of an input data signal;
  a first input transistor including a first control terminal configured to receive the input data signal;
  a second input transistor including a second control terminal configured to receive the boosted input data signal, wherein the first and second input transistors are coupled in parallel between a first node and a first voltage rail; and
  a latch circuit configured to generate an output data signal based on the input data signal, wherein the latch circuit is coupled between a second voltage rail and the first node;
  wherein the boost circuit comprises:
    a third transistor coupled between a second node and the first voltage rail, wherein the third transistor includes a third control terminal configured to receive a first control signal, and wherein the second node is coupled to the second control terminal of the second transistor;
    a fourth transistor coupled between a third voltage rail and the second node, wherein the fourth transistor includes a fourth control terminal configured to receive a second control signal; and
    a capacitor including a first terminal configured to receive a first voltage and a second terminal coupled to the second node;
  wherein the first control signal turns on the third transistor during a first time interval to discharge the capacitor, wherein the second control signal turns off the fourth transistor during the first time interval;
  wherein the second control signal turns on the fourth transistor during a second time interval to allow a second voltage at the third voltage rail to charge the capacitor, wherein the first control signal turns off the third transistor during the second time interval, and wherein the first voltage is at a low logic voltage during the second time interval; and
  wherein the first voltage is raised to a high logic voltage during a third time interval to generate the boosted input data signal, wherein the first and second control signals turn off the third and fourth transistors during the third time interval, respectively.

2. The apparatus of claim 1, wherein the boost circuit is coupled between a third voltage rail and the first voltage rail.

3. The apparatus of claim 2, wherein a supply voltage at the second voltage rail is greater than a supply voltage at the third voltage rail.

4. The apparatus of claim 3, wherein the boosted input signal swings between a high logic voltage and a low logic voltage, wherein the high logic voltage is greater than the supply voltage at the third voltage rail.

5. The apparatus of claim 1, wherein the input data signal swings between a first set of high and low logic voltages in accordance with a first voltage domain, wherein the output data signal swings between a second set of high and low logic voltages, wherein the high logic voltage of the second set is greater than the high logic voltage of the first set.

6. The apparatus of claim 5, wherein the boosted input data signal swings between a third set of high and low logic voltages, wherein the high logic voltage of the third set is greater than the high logic voltage of the first set.

7. The apparatus of claim 1, wherein the boost circuit further comprises a fifth transistor coupled between the second node and the third transistor, wherein the fifth transistor includes a fifth control terminal configured to receive a substantially constant bias voltage.

8. The apparatus of claim 1, further comprising a driver circuit configured to generate the second control signal and the first voltage based on the input data signal.

9. The apparatus of claim 8, wherein the driver circuit comprises:
  a first inverter including an input configured to receive the input data signal;
  a first delay element including an input coupled to an output of the first inverter;
  a NAND gate including a first input coupled to an output of the first delay element, a second input configured to receive the input data signal, and an output configured to generate the second control signal;
  a second delay element including an input coupled to the output of the first delay element; and
  a second inverter including an input coupled to an output of the second delay element and an output configured to generate the first voltage.

10. The apparatus of claim 8, wherein the driver circuit comprises:
  a first inverter including an input configured to receive the input data signal;
  a first delay element including an input coupled to an output of the first inverter;
  an OR gate including a first input coupled to an output of the first delay element, a second input configured to receive the input data signal, and an output configured to generate the second control signal; and a second delay element including an input coupled to the output of the first delay element, and an output configured to generate the first voltage.

11. The apparatus of claim 8, wherein the first control signal comprises a complementary input data signal.

* * * * *